(12) United States Patent
Whittington

(10) Patent No.: US 10,908,183 B2
(45) Date of Patent: Feb. 2, 2021

(54) ACTIVE PROBE POWERED THROUGH DRIVEN COAX CABLE

(71) Applicant: NATIONAL INSTRUMENTS CORPORATION, Austin, TX (US)

(72) Inventor: Mark Whittington, Austin, TX (US)

(73) Assignee: National Instruments Corporation, Austin, TX (US)

( * ) Notice: Subject to any disclaimer, the term of this patent is extended or adjusted under 35 U.S.C. 154(b) by 155 days.

(21) Appl. No.: 16/180,561

(22) Filed: Nov. 5, 2018

(65) Prior Publication Data
US 2019/0137542 A1    May 9, 2019

Related U.S. Application Data

(60) Provisional application No. 62/582,170, filed on Nov. 6, 2017.

(51) Int. Cl.
| | | |
|---|---|---|
| *G01R 1/06* | (2006.01) | |
| *G01R 1/067* | (2006.01) | |
| *H01P 3/06* | (2006.01) | |

(52) U.S. Cl.
CPC ............ *G01R 1/06766* (2013.01); *H01P 3/06* (2013.01)

(58) Field of Classification Search
CPC ............ G01R 1/06766; G01R 1/06772; G01R 1/06788; G01R 1/07328; G01R 31/31905; G01R 35/005
See application file for complete search history.

(56) References Cited

U.S. PATENT DOCUMENTS

| | | | | |
|---|---|---|---|---|
| 4,739,259 | A * | 4/1988 | Hadwin | G01R 1/06766 324/72.5 |
| 6,958,612 | B2 * | 10/2005 | Sakayori | G01R 35/00 324/601 |
| 7,728,607 | B2 * | 6/2010 | Forbes | G01R 1/06772 324/755.02 |
| 9,261,535 | B2 | 2/2016 | Jakobson | |
| 9,562,928 | B2 | 2/2017 | Cheng et al. | |
| 9,671,427 | B2 | 6/2017 | Johnson et al. | |
| 2007/0164731 | A1 * | 7/2007 | Pollock | G01R 1/06766 324/754.07 |
| 2011/0006793 | A1 * | 1/2011 | Peschke | G01R 1/06766 324/754.01 |
| 2013/0221985 | A1 * | 8/2013 | Bartlett | G01R 35/005 324/601 |
| 2014/0056104 | A1 | 2/2014 | Buechler et al. | |
| 2016/0299171 | A1 | 10/2016 | Timm et al. | |

* cited by examiner

*Primary Examiner* — Thang X Le
(74) *Attorney, Agent, or Firm* — Kowert Hood Munyon Rankin and Goetzel PC; Jeffrey C. Hood

(57) ABSTRACT

A novel coupling system may include a head-end circuit for coupling a probe via a cable to an instrument, delivering power to the probe over the cable while the cable carries signal(s) from the probe to the instrument. The head-end circuit may include a first terminal for coupling to the probe via a cable, and may further include a second terminal for coupling to the instrument. The head-end circuit may apply direct-current (DC) power to the cable, and may remove a DC voltage offset resulting from the applied DC power before a signal from the probe reaches the instrument. The head-end circuit may include a common node coupled to the first terminal, a current source coupling the common node to a supply voltage, and a voltage source coupling the common node to a second terminal that couples to the instrument.

20 Claims, 5 Drawing Sheets

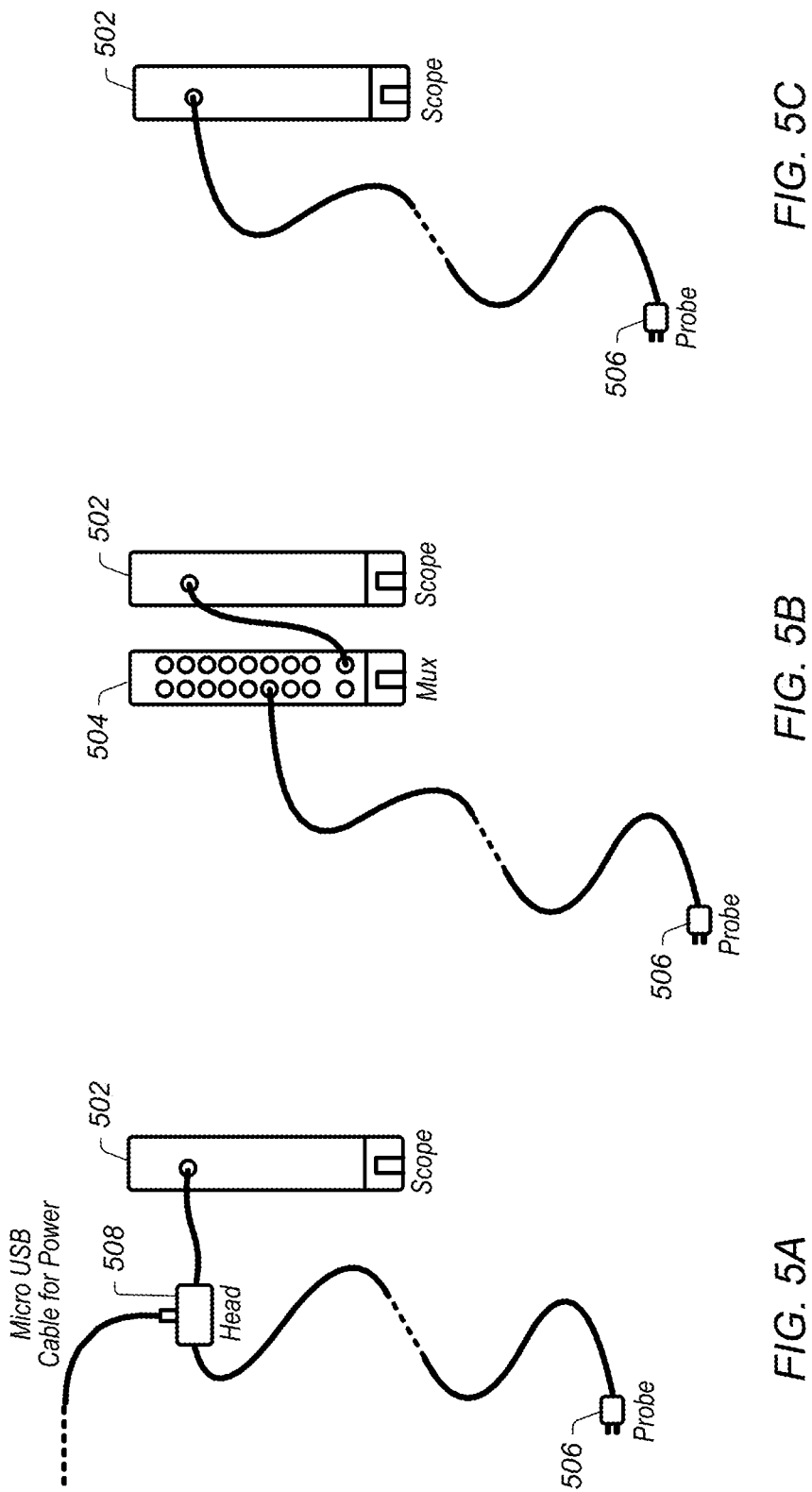

ACTIVE PROBE POWERED THROUGH DRIVEN COAX CABLE

PRIORITY CLAIM

This application claims benefit of priority of U.S. Provisional Patent Application Ser. No. 62/582,170 titled "Oscilloscope Active Probe Powered Through Driven Coax Cable", filed on Nov. 6, 2017, which is hereby incorporated by reference as though fully and completely set forth herein.

BACKGROUND OF THE INVENTION

Field of the Invention

This invention relates generally to measurement and data acquisition systems and, more particularly, to powering active probes through driven coaxial cables.

Description of the Related Art

Measurement systems are oftentimes used to perform a variety of functions, including measurement of physical phenomena, measurement of certain characteristics or operating parameters of a unit under test (UUT) or device under test (DUT), testing and analysis of physical phenomena, process monitoring and control, control of mechanical or electrical machinery, data logging, laboratory research, and analytical chemistry, to name a few examples.

A typical contemporary measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a USB (Universal Serial Bus), a GPM (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT or for influencing the system being controlled. These measurement systems, which can be generally referred to as data acquisition systems (DAQs), are primarily used for converting a physical phenomenon (such as temperature or pressure) into an electrical signal and measuring the signal in order to extract information. PC-based measurement and DAQs and plug-in boards are used in a wide range of applications in the laboratory, in the field, and on the manufacturing plant floor, among others.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and receive digital signals to implement one or more digital I/O applications. DAQ devices may also include Source-Measure Units (SMUs), which may apply a voltage to a DUT and measure the resulting current, or may apply a current to the DUT and measure the resulting voltage. Measurement systems, e.g. DAQ devices as noted above, may also include oscilloscopes and/or other types of signal analyzers, signal generators, function analyzers, etc.

Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a DUT or to influence the system being controlled.

Oscilloscopes are one type of widely used measurement instruments. Oscilloscopes may be used with what are referred to as "active probes", which receive power and transmit signal to the host oscilloscope through separate conductors in the interconnecting cable. If the cable route is to include multiple disconnect points to facilitate modularity (for example, to allow different test fixtures to connect to a standardized factory test station), a connector system may need to have provisions for both coax cable and wire connections. Such connector systems exist but are expensive and bulky. Furthermore, if there is a need to switch multiple active probes to a single oscilloscope channel, an interface panel may be needed to break out the coax cable signal of each probe separately for routing to a relay multiplexer. This is in addition to the requirement for the panel to furnish power to the probes. Hence, the interface panel is an added cost and inconvenience.

Other corresponding issues related to the prior art will become apparent to one skilled in the art after comparing such prior art with the present invention as described herein.

SUMMARY OF THE INVENTION

In various embodiments, disadvantages associated with present day active probes, e.g. active probes used with oscilloscopes, may be overcome by delivering power to the probe over the same coaxial (coax, for short) cable that carries signal back to the oscilloscope from the probe. By delivering power to the probe over the same coax cable that carries signal back to the oscilloscope, multi-conductor cables become unnecessary. The coax cable itself may be an inexpensive commodity item. Switching multiple probes into a single oscilloscope channel may also become easier, since only a coaxial relay multiplexer may be required, and no interface panel is needed. While the various exemplary embodiments discussed herein are in reference to oscilloscopes, other instruments used with active probes may equally benefit from the techniques described herein to deliver power to an active probe over the same coax cable that carries a signal back to the instrument. Thus, various other embodiments may feature instruments other than oscilloscopes, e.g. other measurement instruments or signal generators, function generators, vector analyzers, signal analyzers, or a variety of other similar equipment. The instruments may include multiple components that may themselves be individually characterized as instruments. For example, the instrument may be an oscilloscope, a source measure unit, a digitizer, a vector analyzer, etc.

Pursuant to the above, a novel coupling system may include a head-end circuit to couple an active probe via a cable (e.g. coax cable) to an instrument, whereby power is delivered to the active probe over the same coax cable that carries signal(s) from the probe to the instrument. Accordingly, in some embodiments, a coupling system may include a head-end circuit that includes a first terminal for coupling to a probe via a cable, and may further include a second terminal for coupling to an instrument. The head-end circuit may include active circuitry for applying direct-current (DC) power to the cable while removing a DC voltage offset resulting from the applied DC power before a signal from the probe reaches the instrument. The head-end circuit may include a common node coupled to the first terminal, a current source coupling the common node to a supply voltage, and a voltage source coupling the common node to the second terminal. In some embodiments, the head-end circuit may present a wideband impedance to the cable, with the wideband impedance matching a characteristic impedance of the cable. In some embodiments, the output impedance of the probe is matched to a characteristic impedance of the cable for high bandwidth system operation, while in other embodiments, the output impedance presented by the probe to the cable may be a high impedance that is characteristic of a current source for low bandwidth system operation.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The foregoing, as well as other objects, features, and advantages of this invention may be more completely understood by reference to the following detailed description when read together with the accompanying drawings in which:

FIG. 5a shows a simplified diagram of a system in which a head-end circuit is included inside an adapter powered from a Universal Serial Bus cable, according to some embodiments;

FIG. 5b shows a simplified diagram of a system in which a head-end circuit is built into a special relay multiplexer capable of interfacing many probes to one oscilloscope channel, according to some embodiments; and FIG. 5c shows a simplified diagram of a system in which a head-end circuit is built into an oscilloscope, according to some embodiments.

Figure 1:
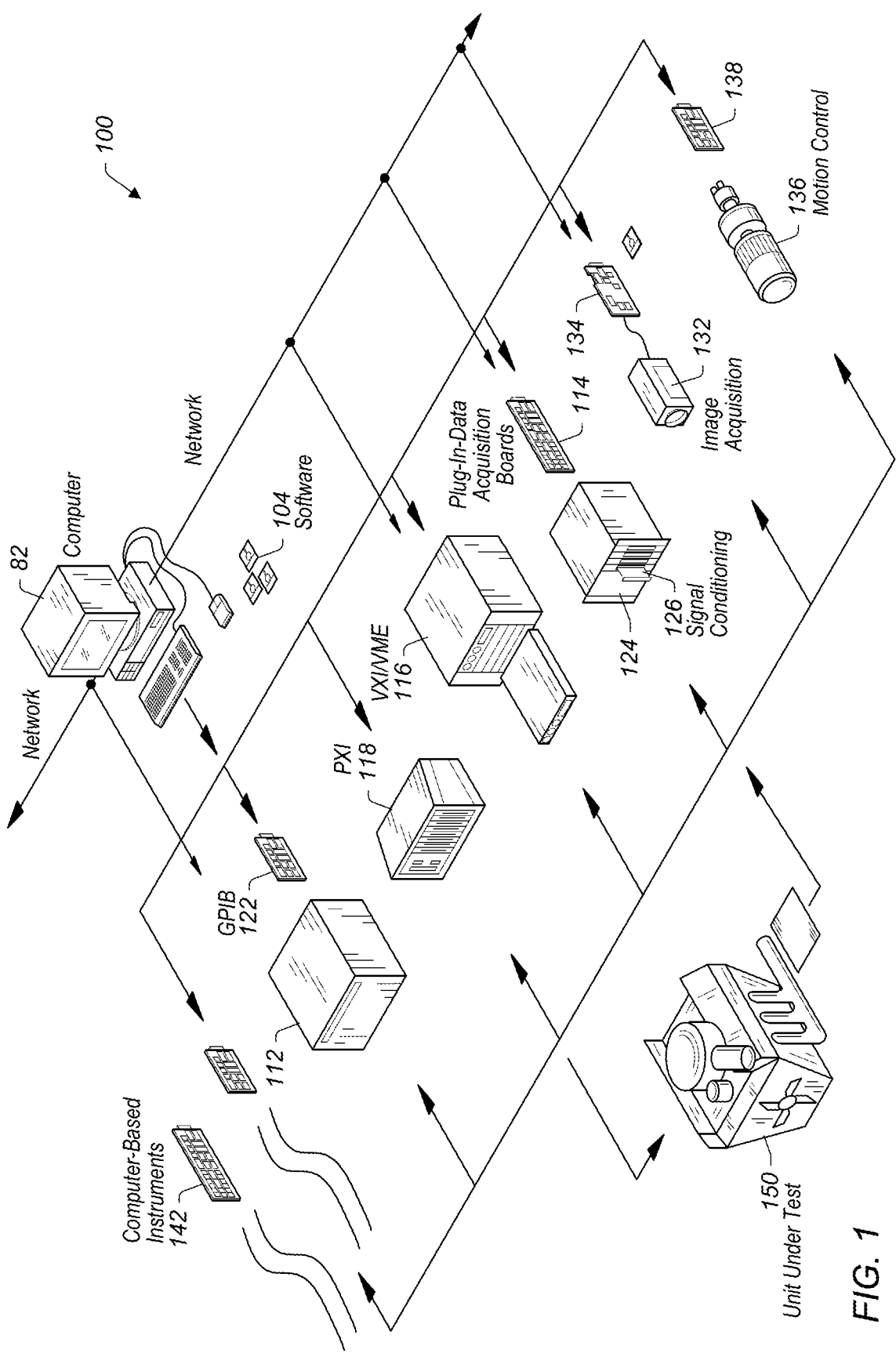
FIG. 1 shows an instrumentation control system with instruments networked together according to one set of embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

Embodiments of the present invention may be used in systems configured to perform test and/or measurement functions, to control and/or model instrumentation or industrial automation hardware, or to model and simulate functions, e.g., modeling or simulating a device or product being developed or tested, etc. However, it is noted that the present invention may equally be used for a variety of applications, and is not limited to the applications enumerated above. In other words, applications discussed in the present description are exemplary only, and the present invention may be used in any of various types of systems. Thus, the system and method of the present invention is operable to be used in any of various types of applications, including the control of other types of devices such as multimedia devices, video devices, audio devices, telephony devices, Internet devices, etc.

FIG. 1 illustrates an exemplary instrumentation control system 100 which may be configured according to embodiments of the present invention. System 100 comprises a host computer 82 which may couple to one or more instruments configured to perform a variety of functions using a head-end circuit for delivering power to a probe (used to connect to the instrument) over the same coax cable which carries the signal back to the instrument, implemented according to various embodiments. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
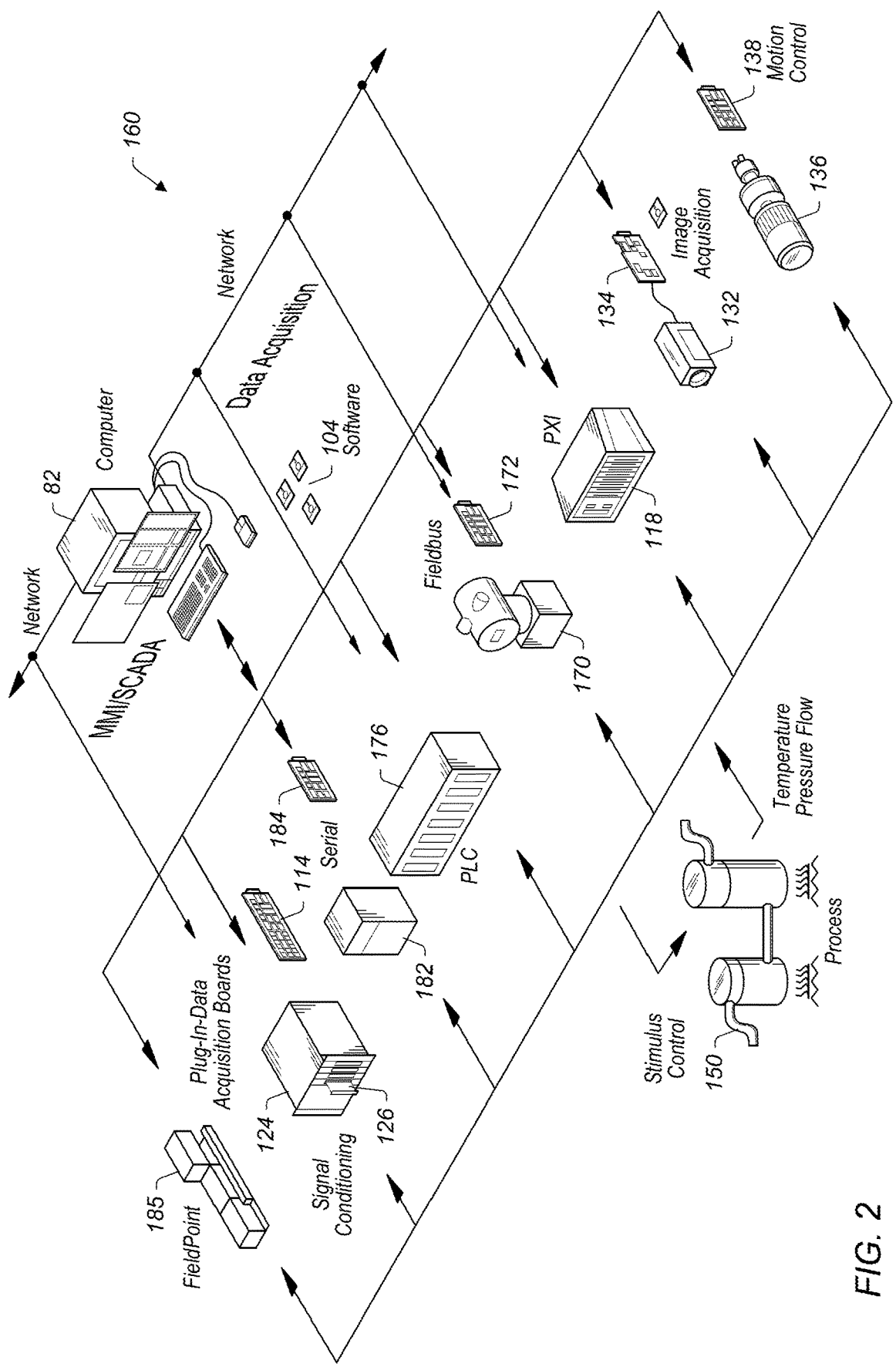
FIG. 2 shows an industrial automation system with instruments networked together according to one set of embodiments.

FIG. 2 illustrates an exemplary industrial automation system 160 that may be configured according to embodiments of the present invention. Industrial automation system 160 may be similar to instrumentation or test and measurement system 100 shown in FIG. 1. Elements that are similar or identical to elements in FIG. 1 have the same reference numerals for convenience. System 160 may comprise a computer 82 which may couple to one or more devices and/or instruments configured to use a head-end circuit for delivering power to a probe (used to connect to the device or instrument) over the same coax cable which carries the signal back to the instrument, according to various embodiments. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection, which may facilitate running a high-level synchronization protocol between the computer system and the coupled instruments/devices.

In one set of embodiments, any one or more of the instruments and/or the various connectivity interfaces of computer 82 (coupling computer 82 to the one or more devices) may be implemented with a head-end circuit for delivering power to a probe (used to connect to any one or more of the instruments and/or connectivity interfaces of computer 82) over the same coax cable that carries the signal back to the instrument, as will be further described in detail below. Generally, various embodiments disclosed herein facilitate an instrument, for example an instrument configured in an automated test system, to be used with active probes without requiring connector systems that have provisions for both coax cable and wire connections, and further without requiring an interface panel that breaks out the coax cable signal of each probe separately for routing to a relay multiplexer for switching multiple active probes to a single instrument.

While various embodiments are described herein in greater detail with respect to an oscilloscope, the connectivity/connection technology described herein may equally be used with, and/or applied to many other test instruments, such as a function generator or digital test equipment (i.e. semiconductor test equipment). In various embodiments, a novel coupling system that includes a head-end circuit may be used to couple an active probe via a cable (e.g. coax cable) to an instrument, whereby power is delivered to the active probe over the same coax cable that carries signal(s) from the probe to the instrument.

Figure 3:
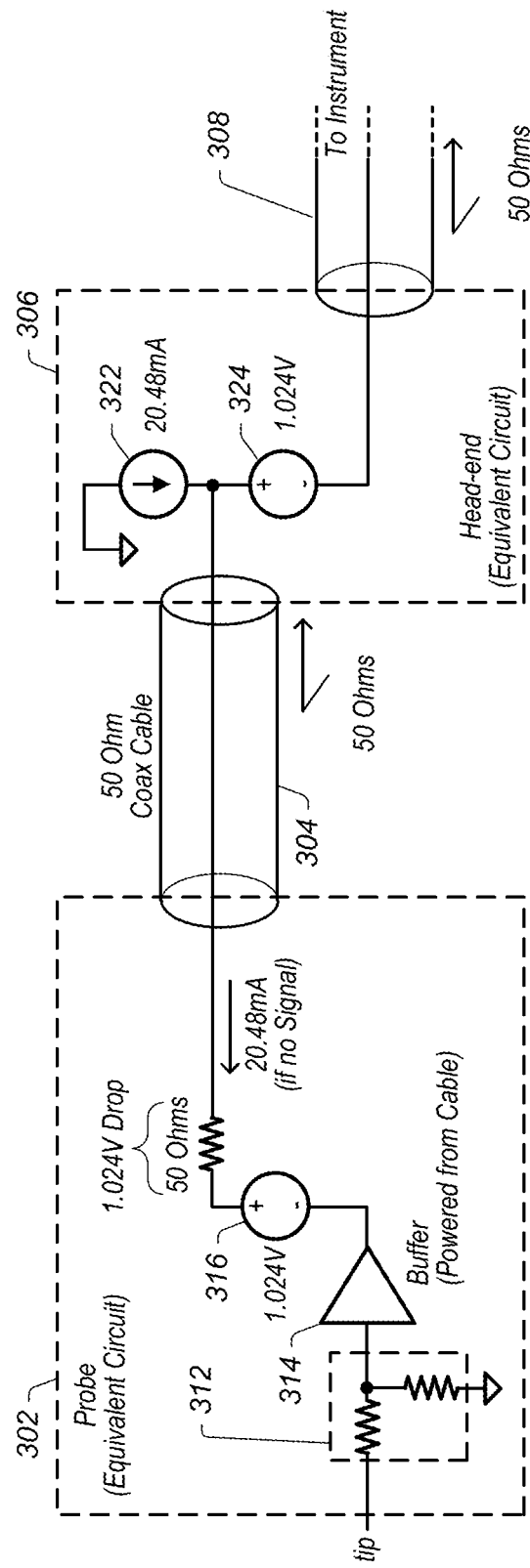
FIG. 3 shows a simplified circuit diagram of an electrical equivalent circuit of an exemplary coupling system in which both the probe and a head-end circuit dynamically match the characteristic impedance of a connecting cable, according to some embodiments.
Figure 4:
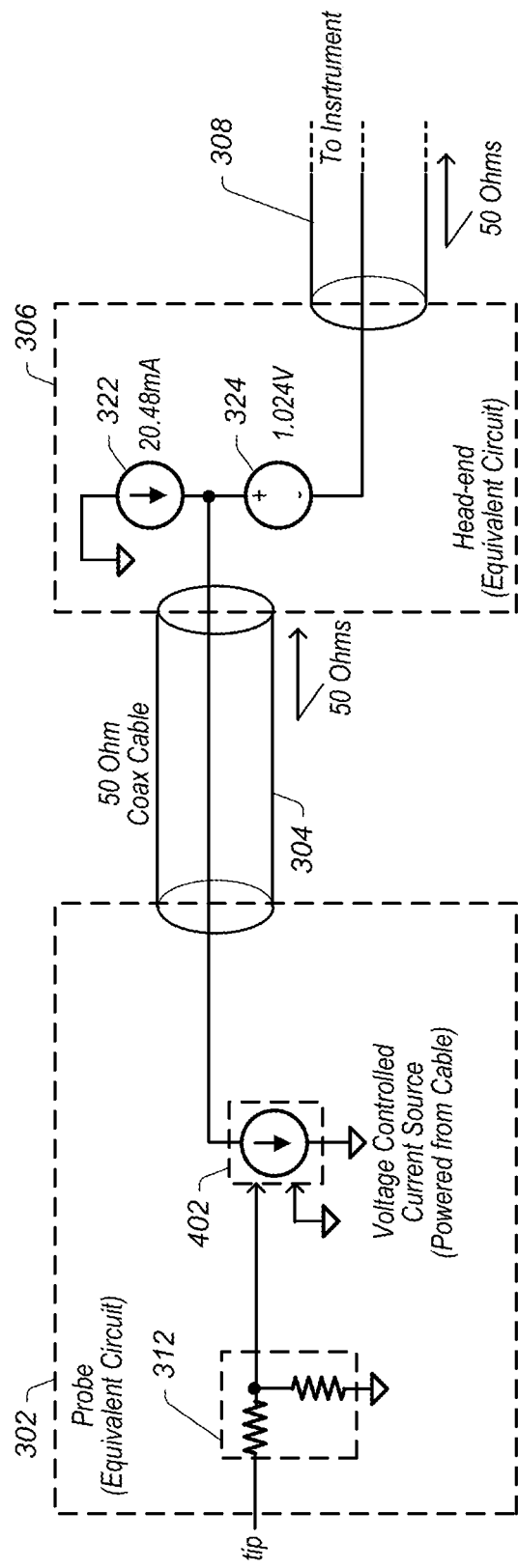
FIG. 4 shows a simplified circuit diagram of an electrical equivalent circuit of an exemplary coupling system in which the probe appears as a current source to a connecting cable, according to some embodiments.

FIG. 3 shows a simplified circuit diagram of an electrical equivalent circuit of a coupling system in which both a probe 302 and a head-end circuit 306 dynamically match the characteristic impedance of a connecting cable 304, according to some embodiments, while FIG. 4 shows a simplified circuit diagram of an electrical equivalent circuit of a coupling system in which the probe 302 appears as a current source to a connecting cable 304, according to some embodiments. As shown in FIG. 3 and FIG. 4, three components are illustrated (not including the instrument, but indicating a connection to an instrument via connecting element/cable 308 as an example). The three illustrated components in both systems, respectively, include an active probe 302, an interconnecting coax cable 304, and a head-end circuit 306. In some embodiments, coax cable 304 may be a commodity-sourced cable with a standard connector type such as MCX on BNC. In general, coax cable 304 represents a connecting cable which may be used with probe 302 to connect to a variety of instruments, e.g. to an oscilloscope. The head-end circuit 306 may have the dual function of applying DC power to the coax cable 304 and removing the resulting DC voltage offset before the signal reaches the instrument. Like other active probes, the active probe 302 of this system may buffer the probed test point (at the tip of probe 302), from the low impedance of the driven cable via input resistance 312 and buffer 314, but the probe may be designed to only receive its power from (or through) that same driven cable 304. Voltage source 316 and the 50Ω resistor represent the equivalent circuit representing the voltage drop across the probe and the impedance of the probe, respectively. The signal values are given by way of example and should not be interpreted as being essential to the description provided herein.

Both the probe 302 and the head-end circuit 306 may be designed to work at a standardized voltage offset. Likewise, both the probe 302 and the head-end circuit 306 may be designed for a standardized DC powering current. In both circuit arrangements, respectively depicted in FIG. 3 and FIG. 4, the standardized voltage is 1.024V and the standardized current is 20.48 mA, represented in the equivalent circuits by current source 322 and voltage source 324. Again, these values are provided as exemplary standardized values specified for the arrangements depicted in FIG. 3 and FIG. 4, and various different embodiments may specify different standardized voltage and current values. As such, these values may change for various different embodiments and are provided as exemplary values only. It should also be noted that the voltage on the coax cable 304 and current flowing through the coax cable 304 may equal the standardized values when there is zero signal deflection, that is, when the voltage at the probe tip equals a common reference voltage, e.g. it equals ground potential. Voltage deviations from 0V at the probe tip may result in proportional voltage deflections away from the standard offset voltage on the cable center conductor.

To prevent signal reflections and standing waves, the head-end circuit 306 input may be designed to present a wideband impedance to the cable 304 that matches the characteristic impedance of the cable 304. The respective circuits shown in FIG. 3 and FIG. 4 satisfy this requirement. FIG. 3 shows an equivalent circuit where the probe's output impedance is also matched to the cable's characteristic impedance, indicated by the 50Ω, resistor within probe 302. This may be considered a preferred arrangement for minimizing signal reflections and the resulting response errors caused by the signal reflections. It should be noted that signal reflections refer to when some of the signal power of a signal is transmitted along a transmission medium (e.g. a cable) is reflected back to the signal's origin rather than being carried all the way along the transmission medium to the signal destination. The above mentioned arrangement may be preferred for a high bandwidth system (for example, a system with 2 GHz bandwidth and a cable length of 1 meter).

For a lower bandwidth system where signal reflections are not as much of a concern, the probe 302 may not need to be impedance matched to the cable 304. As depicted in FIG. 4, probe 302 is not impedance matched to cable 304, and in such cases the probe 302 may present a high impedance to the cable 304 that is typical or characteristic of a current source, as illustrated by equivalent circuit current source 402. Here, the I×R drop along the cable's length has no effect on direct current (DC) or low frequency accuracy. Thus, this arrangement may be preferred where DC or low frequency precision is important.

Several product configurations are possible and contemplated. FIGS. 5a, 5b and 5c illustrate three possible product implementations with embodiments of a head-end circuit for a novel coupling system used to couple an active probe via a cable (e.g. coax cable) to an instrument, delivering power to the active probe over the same coax cable that carries signal(s) from the probe to the instrument. In some embodiments, as illustrated in FIG. 5a, the head-end circuit may be built into an adaptor serving one active probe. As illustrated in FIG. 5b, a special relay multiplexer may include head-end circuits for handling multiple probes, with the multiplexer having the capability to switch any one probe to the oscilloscope channel. As illustrated in FIG. 5c, the head-end circuit may be built into the front end of each instrument, e.g. oscilloscope, channel. Furthermore, in the configuration illustrated in FIG. 5c, placing a conventional relay multiplexer (such as model NI-2593) in front of the oscilloscope may provide the same advantages as the configuration illustrated in FIG. 5b.

Pursuant to the above, an improved active probe system may include an active probe, a head-end circuit that may couple to an instrument, and a cable coupling the active probe to the head-end circuit. The active probe may be used to receive a signal, for example a signal being tested or observed. The head-end circuit may apply DC power to the cable, and may remove a DC voltage offset resulting from the applied DC power before the signal from the active probe reaches the instrument. The active probe may thereby only receive its power from the cable. In some embodiments, the head-end circuit may include a common node where the cable connects to the head-end circuit, a current source coupling the common node to a supply voltage, and a voltage source coupling the common node to the instrument. The head-end circuit may thus present a wideband impedance to the cable, wherein the wideband impedance matches a characteristic impedance of the cable to prevent signal reflections and standing waves. In some embodiments, the output impedance of the active probe may match a characteristic impedance of the cable when the coupling system is configured to operate in a high bandwidth system. In some other embodiments, the output impedance of the active probe presented to the cable may be a high impedance characteristic of a current source when the coupling system is configured to operate in a low bandwidth system. Furthermore, the head-end circuit and the active probe may operate at a same standardized voltage offset and/or at a same standardized DC powering current.

Further pursuant to the above, a measurement system (e.g. as illustrated in FIGS. 5a, 5b, and/or 5c) may include a measurement instrument and a head-end circuit. In some embodiments, the head-end circuit may include a first terminal to couple to an active probe via a cable, a second terminal to couple to the instrument, and active circuitry coupled between the first terminal and the second terminal for applying power (e.g. DC power) to the cable, and remove a voltage offset (e.g. a DC voltage offset) resulting from the applied power before a signal from the active probe reaches the instrument. The head-end circuit may include a common node coupled to the first terminal, a current source coupling the common node to a supply voltage, and a voltage source coupling the common node to the second terminal. The head-end circuit may present a wideband impedance to the cable such that the impedance matches a characteristic impedance of the cable, which may prevent signal reflections and standing waves. The measurement system may include the active probe, with the output impedance of the active probe matching a characteristic impedance of the cable when the coupling system is operating in a high bandwidth system, and the output impedance of the active probe presented to the cable being a high impedance characteristic of a current source when the coupling system is operating in a low bandwidth system. The head-end circuit may be included in an adapter serving the active probe, in a relay multiplexer, or in a front-end of a channel of the instrument. The multiplexer may include additional head-end circuits, and may be capable of coupling any one of the head-end circuit and the additional head-end circuit circuits to the active probe.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

I claim:
1. A coupling system comprising:
  a head-end circuit comprising:
    a first terminal configured to couple to an active probe via a cable;
    a second terminal configured to couple to an electronic instrument; and
    active circuitry coupled between the first terminal and the second terminal and configured to:
      apply direct-current (DC) power to the cable; and
      remove a DC voltage offset resulting from the applied DC power before a signal from the active probe reaches the electronic instrument.

2. The coupling system of claim 1, wherein the head-end circuit comprises:
   a common node coupled to the first terminal;
   a current source coupling the common node to a supply voltage; and
   a voltage source coupling the common node to the second terminal.

3. The coupling system of claim 1, wherein the head-end circuit presents a wideband impedance to the cable, wherein the wideband impedance matches a characteristic impedance of the cable to prevent signal reflections and standing waves.

4. The coupling system of claim 1, further comprising the active probe, wherein an output impedance of the active probe matches a characteristic impedance of the cable when the coupling system is configured to operate in a high bandwidth system.

5. The coupling system of claim 1, further comprising the active probe, wherein an output impedance of the active probe presented to the cable is a high impedance characteristic of a current source when the coupling system is configured to operate in a low bandwidth system.

6. The coupling system of claim 1, wherein the head-end circuit is configured to operate at one or more of:
   a same standardized voltage offset at which the active probe operates; or
   a same standardized DC current at which the probe operates.

7. The coupling system of claim 1, wherein the head-end circuit is comprised in one of:
   an adapter serving the active probe;
   a relay multiplexer capable of coupling the head-end circuit to the active probe; or
   a front-end of a channel of the electronic instrument.

8. An active probe system comprising:
   an active probe configured to receive a signal;
   a cable having one end coupled to the active probe; and
   a head-end circuit coupling another end of the cable to an electronic instrument, and configured to:
      apply direct-current (DC) power to the cable; and
      remove a DC voltage offset resulting from the applied DC power before the signal from the active probe reaches the electronic instrument.

9. The coupling system of claim 8, wherein the active probe is configured to only receive its power from the cable.

10. The coupling system of claim 8, wherein the head-end circuit comprises:
   a common node coupled to the other end of the cable;
   a current source coupling the common node to a supply voltage; and
   a voltage source coupling the common node to the electronic instrument.

11. The coupling system of claim 8, wherein the head-end circuit presents a wideband impedance to the cable, wherein the wideband impedance matches a characteristic impedance of the cable to prevent signal reflections and standing waves.

12. The coupling system of claim 8, wherein an output impedance of the active probe matches a characteristic impedance of the cable when the coupling system is configured to operate in a high bandwidth system.

13. The coupling system of claim 8, wherein an output impedance of the active probe presented to the cable is a high impedance characteristic of a current source when the coupling system is configured to operate in a low bandwidth system.

14. The coupling system of claim 8, wherein the head-end circuit and the active probe are configured to operate at one or more of:
   a same standardized voltage offset; or
   a same standardized DC powering current.

15. A measurement system comprising:
   a measurement instrument; and
   a head-end circuit comprising:
      a first terminal configured to couple to an active probe via a cable;
      a second terminal configured to couple to the measurement instrument; and
      active circuitry coupled between the first terminal and the second terminal and configured to:
         apply power to the cable; and
         remove a voltage offset resulting from the applied power before a signal from the active probe reaches the measurement instrument.

16. The measurement system of claim 15, wherein the head-end circuit comprises:
   a common node coupled to the first terminal;
   a current source coupling the common node to a supply voltage; and
   a voltage source coupling the common node to the second terminal.

17. The measurement system of claim 15, wherein the head-end circuit presents a wideband impedance to the cable, wherein the wideband impedance matches a characteristic impedance of the cable to prevent signal reflections and standing waves.

18. The measurement system of claim 15, further comprising the active probe, wherein an output impedance of the active probe matches a characteristic impedance of the cable when the coupling system is configured to operate in a high bandwidth system.

19. The measurement system of claim 15, further comprising the active probe, wherein an output impedance of the active probe presented to the cable is a high impedance characteristic of a current source when the coupling system is configured to operate in a low bandwidth system.

20. The measurement system of claim 15, wherein the head-end circuit is comprised in one of:
   an adapter serving the active probe;
   a relay multiplexer comprising an additional plurality of head-end circuits, wherein the multiplexer is capable of coupling any one of the head-end circuit and the additional plurality of head-end circuits to the active probe; or
   a front-end of a channel of the measurement instrument.

* * * * *